(12) United States Patent
Lin et al.

(10) Patent No.: US 6,340,309 B1
(45) Date of Patent: Jan. 22, 2002

(54) ZERO INSERTION FORCE SOCKET WITH AN IMPROVED COVER

(75) Inventors: Nick Lin, Hsin-Chuang; Bono Liao, Tu-Chen, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/797,629

(22) Filed: Mar. 1, 2001

(30) Foreign Application Priority Data

Dec. 12, 2000 (TW) .......................................... 89221523

(51) Int. Cl.⁷ ................................................ H01R 4/50
(52) U.S. Cl. ........................................ 439/342; 439/923
(58) Field of Search ................................ 439/342, 259, 439/266, 923

(56) References Cited

U.S. PATENT DOCUMENTS

| 4,137,559 A | * | 1/1979 | Reuting ....................... 439/923 |
| 4,918,513 A | * | 4/1990 | Kurose et al. .............. 439/923 |
| 5,833,483 A | * | 11/1998 | Lai et al. ..................... 439/342 |

* cited by examiner

*Primary Examiner*—Tho D. Ta
(74) *Attorney, Agent, or Firm*—Wei Te Chung

(57) ABSTRACT

A ZIF socket (1) on which a CPU (2) is mounted. The CPU (2) has a plurality of pins (21) extending through a cover (11) into a base (12) of the socket for electrically engaging with contacts (110) received in the base. The cover defines two slots (1112) in two opposite sides of a top face thereof. The slots are located below two side edges of the CPU, whereby there is more space for a user's fingers to grip the CPU to pull it away from the socket in order to replace CPU with another one.

9 Claims, 4 Drawing Sheets

ZERO INSERTION FORCE SOCKET WITH AN IMPROVED COVER

BACKGROUND OF THE INVENTION

1. Field of the Invention

The present invention generally relates to a Zero Insertion Force (ZIF) socket, and particularly to a ZIF socket with an improved cover.

2. Description of the Related Art

A conventional ZIF socket 3, as shown in FIG. 4, engages with a Central Processing Unit (CPU) 4 mounted thereon. To replace the CPU 4, one needs to use fingers to grip lateral sides 41 of the CPU 4 to exert a pulling force thereto. Nevertheless, since the CPU 4 is relatively thin and it has a bottom 42 wholly closely abutting against a top face 31 of a cover 32 of the ZIF socket 3, there is no sufficient space available for the fingers to effectively grip the CPU 4; thus, the replacement of the CPU 4 is somewhat difficult.

Hence, an improved electrical connector is required to overcome the abovementioned problems.

BRIEF SUMMARY OF THE INVENTION

An objective of the present invention is to provide a ZIF socket with an improved structure for facilitating an easy replacement of a CPU mounted on the ZIF socket with another CPU.

Accordingly, a ZIF socket of the present invention comprises a dielectric base receiving a plurality of contacts therein, and a cover slideably mounted on the dielectric base between open and closed positions. The cover comprises a main body and a raised portion in front of the main body. A pair of grooves are defined in an inner face of each of two opposite side walls which extend downwardly from opposite edges of the cover. The pair of grooves receives a pair of elongated blocks formed on one of two opposite lateral sides of the base. A slot is defined in a top face of the main body of the cover between a corresponding pair of grooves. When a CPU is mounted on the cover of the ZIF socket, the slots are located below two lateral edges of the ZIF socket thereby providing sufficient space for a user's fingers to grip the CPU to exert a pulling force thereon, in order to replace the CPU with another one.

Other objects, advantages and novel features of the invention will become more apparent from the following detailed description when taken in conjunction with the accompanying drawings.

DESCRIPTION OF THE PREFERRED EMBODIMENT

Figure 1:
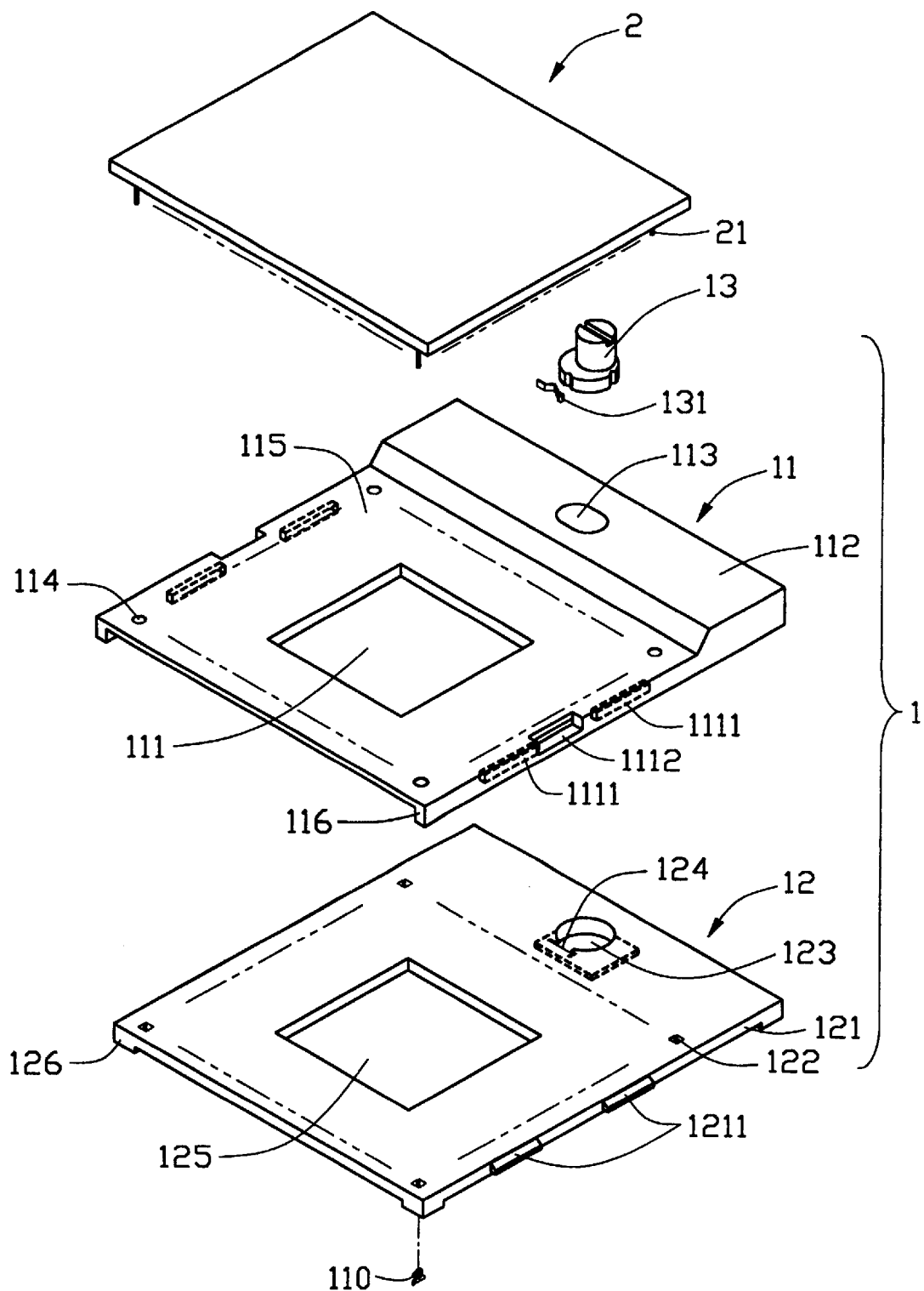
FIG. 1 is an exploded view of a ZIF socket in accordance with the present invention and a CPU.

Referring to FIG. 1, a ZIF socket 1 for mating with a CPU 2 comprises a dielectric base 12, a cover 11 slideably mounted on the dielectric base 12 and a plurality of contacts 110 (only one shown) received in cavities 122 of the base 12 for electrically connecting pins 21 of the CPU 2 to a mother board (not shown).

The cover 11 of the ZIF socket 1 comprises a main body 115 and a raised portion 112 in front of the main body 115. The raised portion 112 defines an elliptic aperture 113 in a middle thereof. A pair of grooves 1111 are defined in an inside of each of two opposite side walls 116 of the cover 11 which are extended downwardly from two opposite edges of the main body 115, respectively. A pair of slots 1112 are defined in a top face of the two opposite edges of the main body 115, respectively. Each slot 1112 is located between a corresponding pair of grooves 1111. The main body 115 also defines a plurality of through holes 114 (only four shown) therein and a rectangular opening 111 in a center thereof.

The dielectric base 12 comprises four standoffs 126 on four corners of a bottom thereof. A circular hole 123 corresponding to the aperture 113 of the cover 11 is defined in a front portion of the dielectric base 12 and communicates with an L-shaped groove 124 defined in rear of the aperture 113. A plurality of cavities 122 (only four shown) which are correspondent to the through holes 114 and used for receiving corresponding contacts 110 therein are defined in the base 12. The dielectric base 12 also defines a rectangular opening 125 in a center thereof which is correspondent to the rectangular opening 111. A pair of elongate blocks 1211 is formed at each of two opposite side edges 121 of the base 12. A driver 13 is received in the circular hole 123 and the elliptic aperture 113. A resilient tab 131 is received in the L-shaped groove 124. The driver 13 and the resilient tab 131 are similar to those described in U.S. Pat. No. 6,116,936, incorporated herein by reference.

Figure 2:
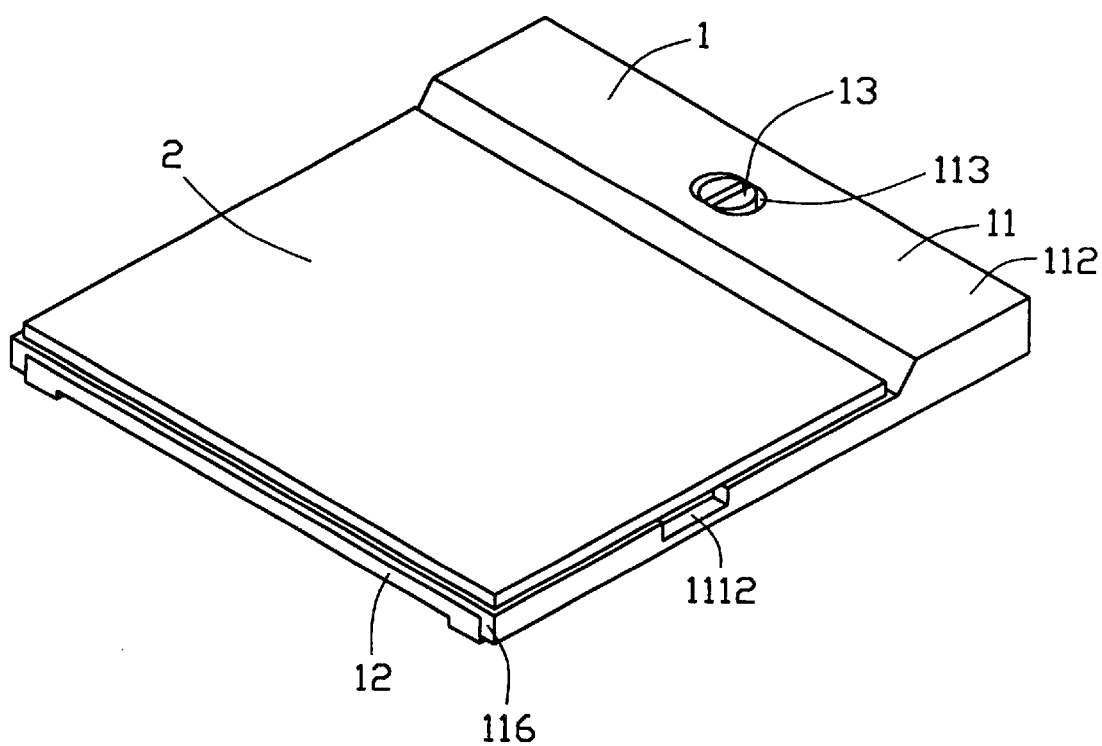
FIG. 2 is an assembled view of FIG. 1.

In assembly, referring to FIGS. 1 and 2, the cover 11 is mounted to the dielectric base 12 with the elongate blocks 1211 being movably received in the grooves 1111 thereby slideably mounting the cover 11 on the base 12. The elliptic aperture 113 of the cover 11 communicates with the circular hole 123 of the dielectric base 12 for receiving the driver 13 therein with the resilient tab 131 of the driver 13 received in the L-shaped groove 124 of the dielectric base 12. By rotating the driver 13, the cover 11 moves relative to the dielectric base 12 between open and closed positions, which has been detailedly disclosed in the incorporated '936 patent; thus, a detailed description thereof is omitted here. The CPU 2 is mounted to the ZIF socket 1 when the driver 13 is rotated to move the cover 11 to the open position, in which pins 21 (only three shown) of the CPU 2 are inserted into corresponding cavities 122 of the base 12 through the through holes 114 of the cover 11. When the driver 13 is rotated to move the cover 11 to the closed position, the pins 21 are moved following the movement of the cover 11 to have an electrical engagement with the contacts 110.

Figure 3:
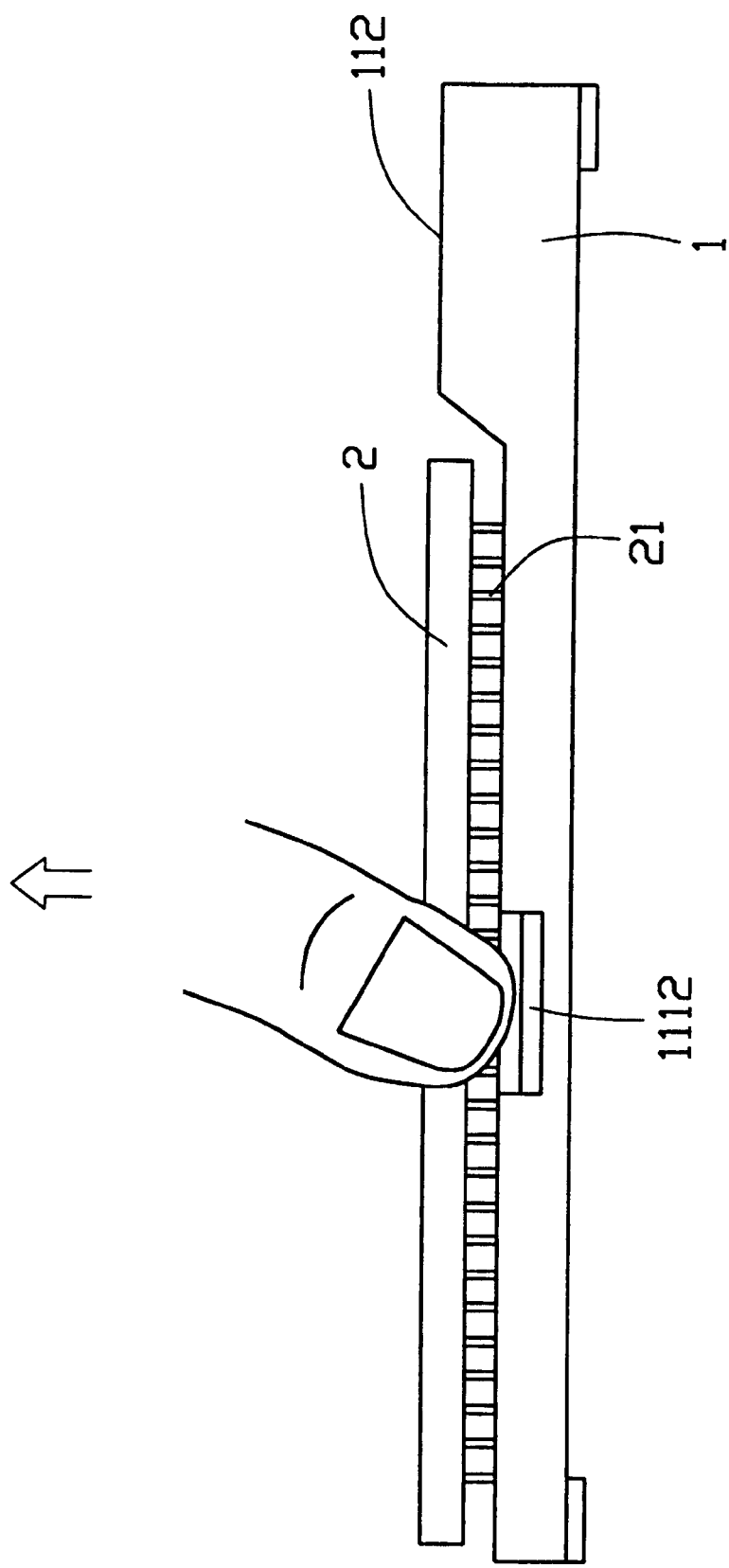
FIG. 3 is a right side view of FIG. 1 showing the CPU to be removed from the socket.
Figure 4:
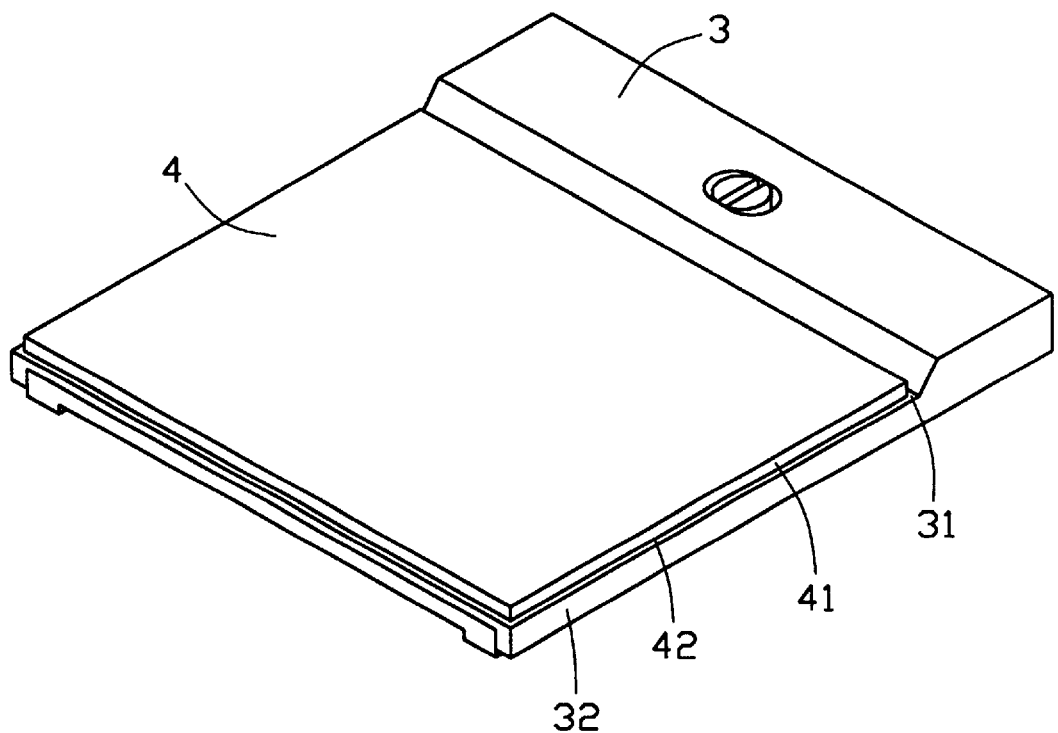
FIG. 4 is a perspective view of a conventional ZIF socket with a CPU mounted thereon.

In the present invention, since the cover 11 is provided with two slots 1112 which are located below two side edges of the CPU 2, when replacing the CPU 2 in which the cover 11 is moved to the open position, there is more space for a user's fingers to grip the side edges of the CPU 2, as shown in FIG. 3; therefore, the CPU 2 can be more easily pulled away from the socket 1 to be replaced with another one.

Referring to FIG. 3, when the CPU 2 is required being removed from the ZIF socket 1, the pair of slots 1112 provides a position for fingers to grasp the CPU 2. The socket 1 of the present invention is more convenient than the cited prior art.

It is to be understood, however, that even though numerous characteristics and advantages of the present invention have been set forth in the foregoing description, together with details of the structure and function of the invention, the disclosure is illustrative only, and changes may be made

What is claimed is:

1. A socket having a Central Processing Unit (CPU) mounted thereon, comprising:
   a dielectric base defining a plurality of cavities receiving a plurality of contacts therein; and
   a cover mounted on the dielectric base defining a plurality of holes in alignment with the cavities; wherein the CPU is mounted on the cove, the CPU having a plurality of pins extending through the holes into the cavities, said cover defining two slots in two lateral side edge portions thereof located below two side edges of the CPU, respectively, whereby a user's fingers can more easily grip the CPU to pull the CPU away from the socket in order to replace the CPU with another one wherein each of said slots does not extend through said corresponding lateral side edge portion.

2. The socket as claimed in claim 1, wherein four standoffs are formed in four corners of a bottom of the dielectric base, respectively.

3. The socket as claimed in claim 1, wherein the cover is movable relative to the base between open and closed positions, in the closed position, the pins of the CPU electrically engaging the contacts.

4. The socket as claimed in claim 3, wherein a pair of elongate blocks is formed in a side edge of the dielectric base, a pair of grooves is defined in an inside of a side wall of the cover, said grooves receiving the elongate blocks.

5. The socket as claimed in claim 4, wherein one of the slots is located between the grooves.

6. An electrical assembly comprising:
   a socket including:
      a dielectric base defining a plurality of cavities receiving a plurality of contacts therein;
      a cover slidably mounted on said base with a plurality of holes in alignment with the corresponding cavities, respectively, in a vertical direction;
      a Central Processing Unit (CPU) seated upon the cover, said CPU being dimensioned not to extend beyond a horizontal contour of said cover; and
   a pair of slots formed in two opposite lateral side edge portions of the cover; wherein
   each of said slots is dimensioned and configured to be large enough to allow a corresponding finger to enter and efficiently grasp a corresponding edge of the CPU, while be small enough not to jeopardize structural strength of said cover thereabouts; wherein
   each of said slots does not extend through said corresponding lateral side edge portion in a lateral direction perpendicular to said vertical direction.

7. The assembly as claimed in claim 6, wherein each of said slots extends along a front-to-back direction of the socket, but does not extend through a corresponding side wall of the cover in said vertical direction.

8. A socket for use with a Central Processing Unit, comprising:
   a dielectric base defining a plurality of cavities receiving a plurality of contacts therein;
   a cover slidably mounted on said base with a plurality of holes in alignment with the corresponding cavities, respectively, in a vertical direction, said cover defining a top face with two opposite side walls downwardly extending from two opposite lateral edges thereof, respectively;
   a pair of slots formed in two opposite lateral side edge portions of the cover; wherein
   each of said slots is formed around a corner of the top face and the corresponding side wall; wherein
   each of said slots does not extend through said corresponding side wall in a lateral direction perpendicular to said vertical direction.

9. The socket as claimed in claim 8, wherein an inward dimension of each of said slots is limited not to touch the corresponding outermost holes thereabouts, and a downward dimension of each of said slots is limited not to extend through the corresponding side wall in said vertical direction.

* * * * *

(12) EX PARTE REEXAMINATION CERTIFICATE (10743rd)

United States Patent
Lin et al.

(10) Number: US 6,340,309 C1
(45) Certificate Issued: Oct. 21, 2015

(54) ZERO INSERTION FORCE SOCKET WITH AN IMPROVED COVER

(75) Inventors: Nick Lin, Hsin-Chuang (TW); Bono Liao, Tu-Chen (TW)

(73) Assignee: HON HAI PRECISION IND. CO., LTD., Tu-Chen, Taipei Hsien (TW)

Reexamination Request:
No. 90/012,891, Jun. 12, 2013

Reexamination Certificate for:
Patent No.: 6,340,309
Issued: Jan. 22, 2002
Appl. No.: 09/797,629
Filed: Mar. 1, 2001

(30) Foreign Application Priority Data

Dec. 12, 2000 (TW) ............................. 89221523 U

(51) Int. Cl.
*H05K 7/10* (2006.01)

(52) U.S. Cl.
CPC ........... *H05K 7/1007* (2013.01); *Y10S 439/923* (2013.01)

(58) Field of Classification Search
None
See application file for complete search history.

(56) References Cited

To view the complete listing of prior art documents cited during the proceeding for Reexamination Control Number 90/012,891, please refer to the USPTO's public Patent Application Information Retrieval (PAIR) system under the Display References tab.

*Primary Examiner* — John M Hotaling

(57) ABSTRACT

A ZIF socket (1) on which a CPU (2) is mounted. The CPU (2) has a plurality of pins (21) extending through a cover (11) into a base (12) of the socket for electrically engaging with contacts (110) received in the base. The cover defines two slots (1112) in two opposite sides of a top face thereof. The slots are located below two side edges of the CPU, whereby there is more space for a user's fingers to grip the CPU to pull it away from the socket in order to replace CPU with another one.

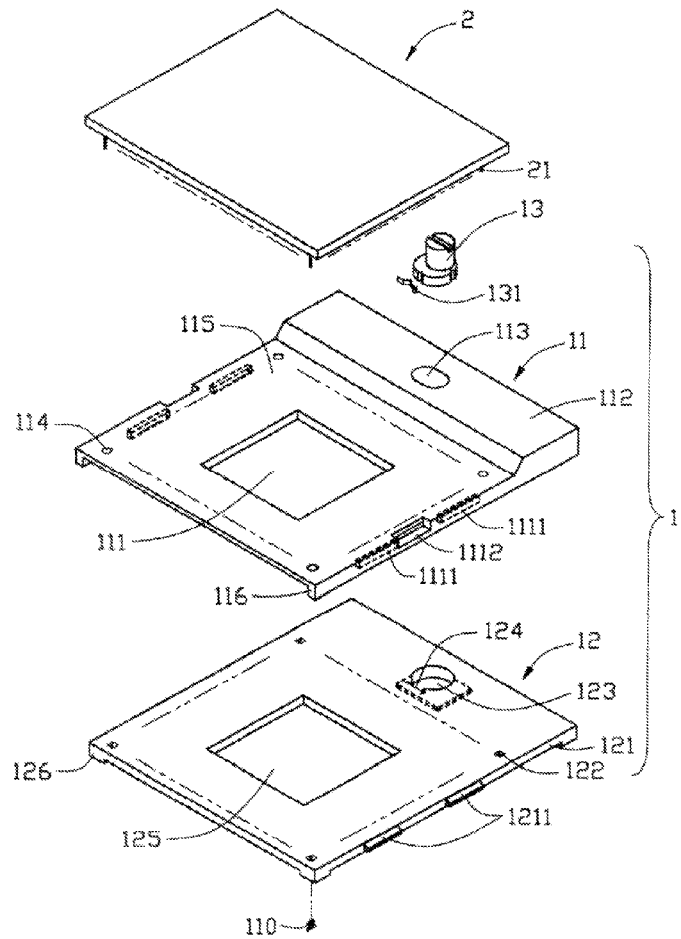

EX PARTE
REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-9 are cancelled.

\* \* \* \* \*